United States Patent
Huang et al.

(10) Patent No.: US 8,526,242 B2
(45) Date of Patent: Sep. 3, 2013

(54) FLASH MEMORY AND FABRICATION METHOD AND OPERATION METHOD FOR THE SAME

(75) Inventors: Ru Huang, Beijing (CN); Yimao Cai, Beijing (CN); Shiqiang Qin, Beijing (CN); Qianqian Huang, Beijing (CN); Poren Tang, Beijing (CN); Yu Tang, Beijing (CN); Gengyu Yang, Beijing (CN)

(73) Assignee: Peking University, Beijing (CN)

( * ) Notice: Subject to any disclaimer, the term of this patent is extended or adjusted under 35 U.S.C. 154(b) by 78 days.

(21) Appl. No.: 13/321,120

(22) PCT Filed: Mar. 7, 2011

(86) PCT No.: PCT/CN2011/071550
§ 371 (c)(1),
(2), (4) Date: Nov. 17, 2011

(87) PCT Pub. No.: WO2012/051824
PCT Pub. Date: Apr. 26, 2012

(65) Prior Publication Data
US 2012/0113726 A1   May 10, 2012

(30) Foreign Application Priority Data
Oct. 22, 2010   (CN) .......................... 2010 1 0523321

(51) Int. Cl.
*G11C 11/34* (2006.01)
(52) U.S. Cl.
USPC ............ 365/185.33; 365/185.02; 365/185.03; 365/185.05; 365/185.26
(58) Field of Classification Search
USPC ............. 365/185.33, 185.02, 185.03, 185.05, 365/185.26
See application file for complete search history.

(56) References Cited

U.S. PATENT DOCUMENTS

| | | | |
|---|---|---|---|
| 5,945,705 A | 8/1999 | Liu et al. | |
| 6,313,487 B1 | 11/2001 | Kencke et al. | |
| 6,885,044 B2* | 4/2005 | Ding | 257/202 |
| 6,934,404 B2* | 8/2005 | Yokoi | 382/101 |
| 6,951,782 B2* | 10/2005 | Ding | 438/137 |
| 7,149,126 B2* | 12/2006 | Ogura et al. | 365/185.29 |
| 7,154,779 B2* | 12/2006 | Mokhlesi et al. | 365/185.01 |
| 7,241,654 B2* | 7/2007 | Forbes | 438/209 |
| 7,369,436 B2* | 5/2008 | Forbes | 365/185.17 |
| 7,378,707 B2* | 5/2008 | Bhattacharyya | 257/328 |
| 7,411,823 B2* | 8/2008 | Forbes et al. | 365/185.05 |
| 7,457,159 B2* | 11/2008 | Bhattacharyya et al. | 365/185.08 |
| 7,547,599 B2* | 6/2009 | Sandhu et al. | 438/257 |
| 7,829,938 B2* | 11/2010 | Bhattacharyya | 257/325 |
| 8,288,813 B2* | 10/2012 | Kakoschke et al. | 257/315 |

FOREIGN PATENT DOCUMENTS

CN   1805146 A   7/2006

* cited by examiner

*Primary Examiner* — Viet Q Nguyen
(74) *Attorney, Agent, or Firm* — Maschoff Brennan

(57) ABSTRACT

The present invention discloses a flash memory and the fabrication method and the operation method for the same. The flash memory comprises two memory cells of vertical channels, wherein a lightly-doped N type (or P type) silicon is used as a substrate; a P+ region (or an N+ region) is provided on each of the both ends of the silicon surface, and two channel regions perpendicular to the surface are provided therebetween; an N+ region (or a P+ region) shared by two channels is provided over the channels; a tunneling oxide layer, a polysilicon floating gate, a block oxide layer and a polysilicon control gate are provided sequentially on the outer sides of each channel from inside to outside; and the polysilicon floating gate and the polysilicon control gate are isolated from the P+ region by a sidewall oxide layer. The whole device is a two-bit TFET type flash memory with vertical channels which has better compatibility with prior-art standard CMOS process. As compared with a conventional MOSFET-based flash memory, the flash memory according to the present invention possesses various advantages such as high programming efficiency, low power consumption, effective inhibition of punch-through effect, and high density, etc.

3 Claims, 5 Drawing Sheets

FLASH MEMORY AND FABRICATION METHOD AND OPERATION METHOD FOR THE SAME

FIELD OF THE INVENTION

The present invention relates to the field of nonvolatile semiconductor memory technology in the ultra large scale integrated circuit, in particular to a flash memory with high performance which employs a TFET (Tunneling Field Effect Transistor).

BACKGROUND OF THE INVENTION

Currently, the semiconductor industry is at a rapidly developing stage, the requirement on the performances of various electronic devices becomes higher and higher, which inevitably involves semiconductor memories widely used in various electronic products. Also, with the occurrence of large number of mobile electronic products (such as laptop PC, MP3, MP4, digital camera, etc.), the demand for nonvolatile semiconductor memory with high performance becomes more urgent.

In the whole development history of the nonvolatile semiconductor memories, flash memory is playing an important role. Since the 1980's when such memory emerged, the flash memory has always been a memory device widely used in the industry due to its excellent characteristics. This memory changes the threshold voltage of the whole device by storing or erasing electrons in a special structure of the device so as to accomplish the distinguishing between the two states of "0" and "1" and achieve the storage function. As for the said special structure for storing electrons, during the development of flash memory, there have been two forms emerged successively:

1. Floating Gate Flash Memory

With respect to the flash memory with such structure, the storage of electrons is achieved by using a polysilicon floating gate. Over a bulk silicon substrate 101, in addition to a source 102 and a drain 103, a tunneling oxide layer 104, a polysilicon floating gate 105, a block oxide layer 106 and a control gate 107 are sequentially arranged over a channel, as particularly shown in FIG. 1. It is to be indicated that the electrons of such structure are distributed continuously on the floating gate.

2. Discrete Trap Flash Memory

Compared with the floating gate flash memory, the structure for storing electrons of a discrete trap flash memory is a silicon nitride trap layer rather than a polysilicon floating gate, while the remaining structure of the discrete trap flash memory is substantially the same as that of the floating gate flash memory. The electrons stored in the silicon nitride layer are localized and are not continuous. Therefore, if a leakage path occurs due to the damage of the tunneling oxide layer, only the electrons in the path region are leaked through the leakage path, while the electrons stored in other parts are not reduced, so that the retaining characteristic of the whole device is improved.

During the later development, although a lot of intensive improvement works have been made on the basis of the above mentioned structures to meet various new requirements on storage, lots of improvements of the above two flash memory structures are not going well due to the limitation of their basic physical mechanisms. Especially, in the case where the whole semiconductor industry follows the Moor Law and the feature size is gradually scaled-down, the flash memory is facing with more serious challenges including, among others, inhibiting the punch-through effect in a short channel, increasing the programming efficiency and reducing the power consumption, etc.

On the other hand, a tunneling field effect transistor (referred as TFET) is a transistor based on the quantum tunneling effect. The structural difference between the tunneling field effect transistor and the conventional MOS transistor is that, in the tunneling field effect transistor, the source and the drain are of two different doping types and both an N type slightly doped silicon (N− type silicon) and a P type slightly doped silicon (P− type silicon) may be used as a substrate. FIG. 2 is a schematic diagram illustrating the structure of a TFET using an N− type silicon as a substrate 201, wherein an N+ terminal 202 and a P+ terminal 203 are on the two ends of the silicon plane respectively, and a gate oxide layer 204 and a polysilicon gate 205 are sequentially disposed over a channel. In the case where no external voltage is applied to each terminal, the energy band along the channel direction is shown in FIG. 3($a$), in this case the whole transistor is in the off status. In the case where sufficient negative bias and positive bias are applied to the P+ terminal 203 and the N+ terminal 202, respectively and an appropriate positive bias is applied to the polysilicon gate 205, the energy band along the channel direction is shown in FIG. 3($b$). If the biases applied are sufficient to bend the energy band of the interface between the P+ terminal 203 and the channel so that the band to band tunneling occurs, the electrons will tunnel to the conduction band of the channel region from valence band of the P+ terminal 203 so as to drift to the N+ terminal 202 under the action of the electric field along the channel direction. In this case, such transistor is used as an N type TFET, wherein the N+ terminal 202 is used as a drain while the P+ terminal 203 is used as a source. In the case where sufficient negative bias and positive bias are applied to the P+ terminal 203 and an N+ terminal 202, respectively, and an appropriate negative bias is applied to the polysilicon gate 205, the energy band along the channel direction is shown in FIG. 3($c$). If the biases applied are sufficient to bend the energy band of the interface between the N+ terminal 202 and the channel so that the band to band tunneling occurs, the electrons will tunnel to the N+ terminal 202 from the valence band of the channel region, while the remaining holes will sweep to the P+ 203 rapidly under the action of a strong electric field. In this case, such transistor is used as a P type TFET, wherein the P+ terminal 203 is used as a drain while the N+ terminal 202 is used as a source.

SUMMARY OF THE INVENTION

With respect to the serious challenge on various performance indices to which the conventional flash memory is facing, with the combination of a tunneling field effect transistor (referred as TFET), an object of the present invention is to provide a structure of a flash memory with high performance so as to improve the programming efficiency, reduce the power consumption and inhibit the surface punch-through effect under the short channel.

The technical solution of the present invention is as follows:

A flash memory comprises two memory cells having vertical channels and uses a lightly doped N type silicon (i.e. N− type silicon) as a substrate, wherein, a P+ region is disposed on each of the both ends of the silicon surface, and two channel regions perpendicular to the surface are disposed therebetween; an N+ region shared by the two channels is disposed over the channels; and a tunneling oxide layer, a polysilicon floating gate, a block oxide layer and a polysilicon control gate are disposed sequentially on each of the outer side of each channel from inside to outside, and the polysilicon floating gates and the polysilicon control gates are isolated from the P+ regions by a sidewall oxide layer. The whole device comprises a 2-bit TFET type flash memory with vertical channels.

A lightly doped P type silicon (i.e. P-type silicon) may also be used as a substrate instead of the lightly doped N type silicon. In this case, in the 2-bit TFET type flash memory with vertical channels, an N+ region is disposed on each of the both ends of the silicon surface, and two channel regions perpendicular to the surface are disposed therebetween; a P+ region shared by the two channels is disposed over the channels; and a tunneling oxide layer, a polysilicon floating gate, a block oxide layer and a polysilicon control gate are disposed sequentially on each of the outer side of each channel from inside to outside, and the polysilicon floating gates and the polysilicon control gates are isolated from the N+ regions by a sidewall oxide layer.

The present invention further provides a fabrication method for the above mentioned flash memory, comprising following steps:

1) performing a shallow trench isolation with respect to an N− type or a P− type bulk silicon substrate to form an active region, and performing ion implantation with respect to the silicon surface to form an N+ layer (corresponding to an N− type silicon substrate) or a P+ layer (corresponding to a P− type silicon substrate);

2) sequentially depositing silicon dioxide and silicon nitride on the N+ layer or P+ layer, and performing anisotropic etching with respect to the silicon dioxide and the silicon nitride to form a double-layered hard mask;

3) performing an anisotropic etching with respect to the silicon under the protection of the double-layered hard mask to form an N+ region (corresponding to the N− type silicon substrate) or a P+ region (corresponding to the P− type silicon substrate);

4) performing an isotropic etching with respect to the silicon until the lower end of the channel to form a channel surface under the double-layered hard mask;

5) performing an ion implantation at a certain angle with respect to the silicon surface on the outer side of the channel to form two P+ regions (corresponding to the N− type silicon substrate) or N+ regions (corresponding to the P− type silicon substrate);

6) thermally growing an oxide sacrifice layer to improve the surface property of the channel and removing the oxide sacrifice layer by wet etching, then thermally growing an oxide layer; subsequently, depositing a layer of polysilicon, and performing a heavy doping and a rapid thermal annealing (RTA) for activating the impurities with respect to the layer of polysilicon;

7) performing an anisotropic etching with respect to the polysilicon formed in step 6) to remain the polysilicon directly under the double-layered hard mask, so as to from a polysilicon floating gate; then etching the oxide layer on the outer side of the floating gate to expose the silicon substrate;

8) depositing an oxide layer to form a block oxide layer and a sidewall oxide layer; subsequently, depositing another layer of polysilicon; implanting impurities (such as phosphorus, arsenic) at an angle of 0 degree into the layer of polysilicon and performing a RTA to activate the impurities, and then etching the layer of polysilicon to form a control gate.

The reason of removing the oxide layer on the outer side of the floating gate by etching in step 7) is that the oxide layer formed in step 6) is used as a tunneling oxide layer, the thickness of which generally is relatively small, so that the leakage current between the control gate and the P+ region (corresponding to the N− type substrate) or N+ region (corresponding to the P− type substrate) is easy to occur, therefore, it is necessary to remove the oxide layer first and to deposit a new oxide layer subsequently in step 8) so as to form a oxide block layer and a sidewall oxide layer that are relatively thick.

The flash memory of the present invention has two memory cells, any one of which is able to independently accomplish a storage operation.

With respect to the flash memory using N− type silicon as a substrate of the present invention, the operation method for one of the memory cell is as follows:

In the case of programming, a positive bias is applied to the N+ region and the P+ region is grounded or a negative bias is applied to the P+ region while a positive bias is applied to the control gate. Under such biases, similar to an N type TFET, the electrons may tunnel to the conduction band of the channel region from the valence band of the P+ region. The electrons entering the channel region drift towards the N+ region along the channel direction under the action of the transverse electric field. During this process, due to the applied electric field, a part of electrons may obtain sufficient energy to go beyond the barrier height of Si—SiO$_2$ so as to get into the polysilicon floating gate through the tunneling oxide layer, so that the programming of the memory cell is accomplished.

In the case of erasing, a positive bias is applied to the N+ region and the P+ region is grounded or a negative bias is applied to the P+ region, while a negative bias is applied to the control gate. Under such biases, similar to the P type TFET, the electrons may tunnel to the conduction band of the N+ region from the valence band of the channel region. The holes remaining in the channel region may drift towards the P+ region along the channel direction under the action of the strong electric field. During this process, due to the applied electric field, a part of holes may obtain sufficient energy so as to reach the polysilicon floating gate through the tunneling oxide layer in a way of tunneling, and recombine with the electrons therein, so that the erase of the memory cell is accomplished.

In the case of reading, a positive bias is applied to the N+ region and the P+ region is grounded or a negative bias is applied to the P+ region, while a lower positive bias is applied to the control gate. The settings of the biases require reading a current from the N+ region without performing a false programming. The quantity of the electrons stored in the floating gate may influence the potential finally coupled to the floating gate, so as to influence the current read from the drain terminal (N+ region). Thus, the current read from the drain terminal reflects the quantity of the electrons stored in the floating gate and the distinguishing between two statuses is accomplished so that the function of storage is achieved.

During the process of performing the programming, erasing and reading to a cell, in order not to cause crosstalk to another cell, the control gate of another cell is grounded while the bias of the P+ region is the same as the cell to which the operation is performing.

With respect to the flash memory using a P− type silicon as a substrate, the operation thereof is identical with that of the flash memory using the N− type silicon as a substrate. In particular, the operation method for one of the memory cells is as follow:

In the case of programming, a positive bias is applied to the N+ region and the P+ region is grounded or a negative bias is applied to the P+ region, while a positive bias is applied to the control gate. Under such biases, similar to an N type TFET, the electrons may tunnel to the conduction band of the channel region from the valence band of the P+ region. The electrons entering into the channel region drift towards the N+ region along the channel direction under the action of a transverse electric field. During this process, due to the applied electric field, a part of electrons may obtain sufficient high energy to go beyond the barrier height of Si—SiO$_2$ so as to get into the polysilicon floating gate through the tunneling oxide layer, so that the programming of the memory cell is accomplished.

In the case of erase operation, a positive bias is applied to the N+ region and the P+ region is groundeded or a negative bias is applied to the P+ region, while a negative bias is applied to the control gate. Under such biases, similar to the P type TFET, the electrons may tunnel to the conduction band of the N+ region from the valence band of the channel region. The holes remaining in the channel region may drift towards the P+ region along the channel direction under the strong electric field. During this progress, due to the applied electric field, a part of holes may obtain sufficient energy so as to reach the polysilicon floating gate through the tunneling oxide layer in a way of tunneling and recombine with the electrons therein, so that the erase of the memory cell is accomplished.

In the case of reading, a positive bias is applied to the N+ region and the P+ region is grounded or a negative bias is applied to the P+ region, while a lower positive bias is applied to the control gate. The settings of the biases require reading a current from the N+ region without performing an false programming. The quantity of the electrons stored in the floating gate may influence the potential finally coupled to the floating gate, so as to influence the current read from the drain terminal (N+ region). Thus, the current read from the drain terminal reflects the quantity of the electrons stored in the floating gate and the distinguishing between two statuses is accomplished so that the function of storage is achieved.

During the process of performing the programming, erasing and reading to a cell, in order not to cause crosstalk to another cell, the control gate of another cell is grounded while the bias of the N+ region is the same as the cell to which the operation is performing.

By incorporating the tunneling field effect transistor (TFET), the present invention provides a structure of a flash memory which has better compatibility with prior-art standard CMOS process and is greatly improved compared with the conventional flash memory. The flash memory of the present invention possesses various advantages such as high programming efficiency, low power consumption, effective inhibition of punch-through effect and high density, etc.

Taking the flash memory with an N− type silicon substrate as an example, under the bias condition of programming, the energy band of the interface between the P+ region and the channel will be obviously bended and a phenomenus of the band-to-band tunneling will occur. In this case, there will be a large voltage drop where the energy band is bended, that is, the peak value of the transverse electric field is located near the P+ region of the source terminal, so that the electrons may obtain very high energy once entering the channel so as to enter the floating gate by going beyond the barrier. Whereas, when performing programming in a conventional flash memory, the peak value of the transverse electric field along the channel direction is located near the drain terminal. Before the electrons reach the location of the peak value, the energy thereof is very low and not sufficient to go beyond the Si/SiO$_2$ barrier, however, when obtaining higher energy by reaching the location of the peak value, the electrons may be at a high risk of being absorbed into the drain terminal because of being very close to the drain terminal, which greatly reduces the programming efficiency. It has been proved by simulation that the programming efficiency of the flash memory according to the present invention is higher than that of the conventional flash memory by 2 to 3 orders of magnitude.

In the case where the programming efficiency is greatly improved, the electrons from the P+ region of the flash memory according to the present are implanted efficiently into the floating gate, which greatly reduces the drain terminal current ineffective to the programming and shortens the programming time, so that the reduction of power consumption is achieved.

Further, when being small in size, the depletion regions of the source junction and the drain junction may be communicated in a conventional MOSFET-based flash memory, which results in that a high current flows to the drain from the source, so that the normal achievement of function is affected. Whereas, with respect to the flash memory according to the present invention, since the source junction and the drain junction may not present at the same time, the punch-through effect may be inhibited to a large extent. Meanwhile, since double-channel structure of vertical channel is employed in the device, two-bit storage may be achieved within one cell area, so that the storage density is improved.

BRIEF DESCRIPTION OF THE DRAWINGS

FIG. 3 illustrates the energy band diagrams of the device in FIG. 2 along the channel direction under various bias conditions, wherein:
FIG. 3 (*a*) is the energy band diagram when each terminal is not applied with any bias;
FIG. 3(*b*) is the energy band diagram when the device of FIG. 2 is used as an N type TFET (the N+ terminal 202 is applied with a positive voltage and the P+ terminal 203 is grounded or applied with a negative voltage, while the polysilicon gate 205 is applied with a higher positive voltage);
FIG. 3(*c*) is the energy band diagram when the device of FIG. 2 is used as a P type TFET (the N+ terminal 202 is applied with a positive voltage and the P+ terminal 203 is grounded or applied with a negative voltage, while the polysilicon gate 205 is applied with a higher negative voltage).

412—P+ region II (corresponding to N− type silicon substrate) or N+ region II (corresponding to the P− type silicon substrate); 413—silicon oxide sidewall I; 414—silicon oxide sidewall II.

FIG. 5(a) to FIG. 5(h) are schematic diagrams illustrating structures of the products corresponding to each step of the process flow for fabricating a flash memory with an N− silicon substrate according to an embodiment, wherein:

401—N− type silicon substrate; 402—P+ region I; 403—N+ region I; 404—control gate I; 405—block oxide layer I; 406—polysilicon floating gate I; 407—tunneling oxide layer I; 408—control gate II; 409—block oxide layer II; 410—polysilicon floating gate II; 411—tunneling oxide layer II; 412—P+ region II; 413—silicon oxide sidewall I; 414—silicon oxide sidewall II; 415—silicon oxide hard mask; 416—silicon nitride hard mask.

DETAILED DESCRIPTION OF THE EMBODIMENTS

Hereinafter, the fabrication of the flash memory according to the present invention and the basic operation mode of such flash memory are further described by taking a flash memory with an N− type silicon substrate as an example and with combination of accompanying drawings. However, the scope of the present invention is not limited hereby, and the present invention may also be suitable for a flash memory with P− type silicon used as a substrate.

Figure 1:
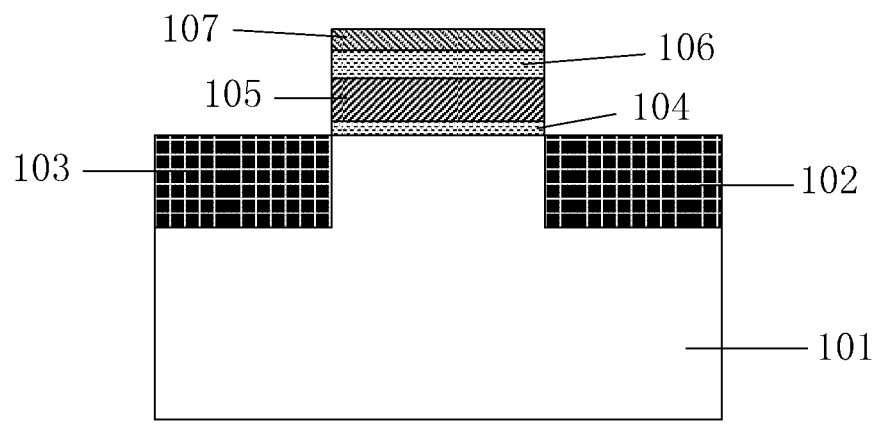
FIG. 1 is a schematic diagram illustrating the cross section structure of a floating gate type flash memory, wherein:
101—bulk silicon substrate; 102—drain terminal; 103—source terminal; 104—tunneling oxide layer; 105—polysilicon floating gate; 106—block oxide layer; 107—polysilicon control gate.
Figure 2:
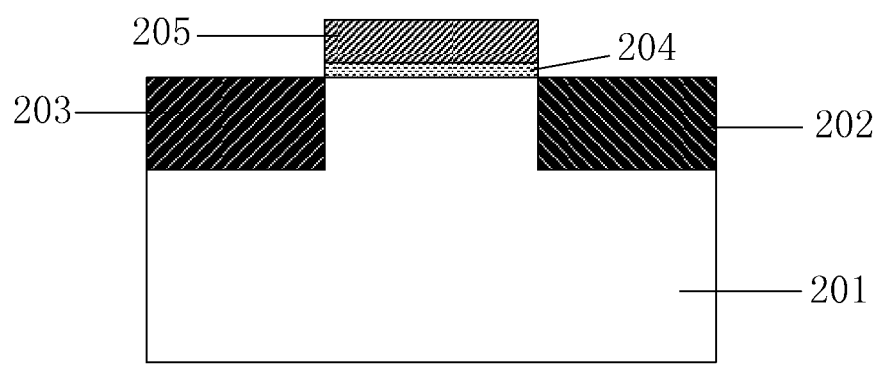
FIG. 2 is a schematic diagram illustrating the cross section structure of a TFET, wherein:
201—bulk silicon substrate (N− doped); 202—N+ terminal (which is used as a drain terminal in the case of N type TFET, and which is used as a source terminal in the case of P type TFET); 203—P+ terminal (which is used as a drain terminal in the case of P type TFET, and which is used as a source terminal in the case of N type TFET); 204—gate oxide layer; 205—polysilicon gate.
Figure 3:
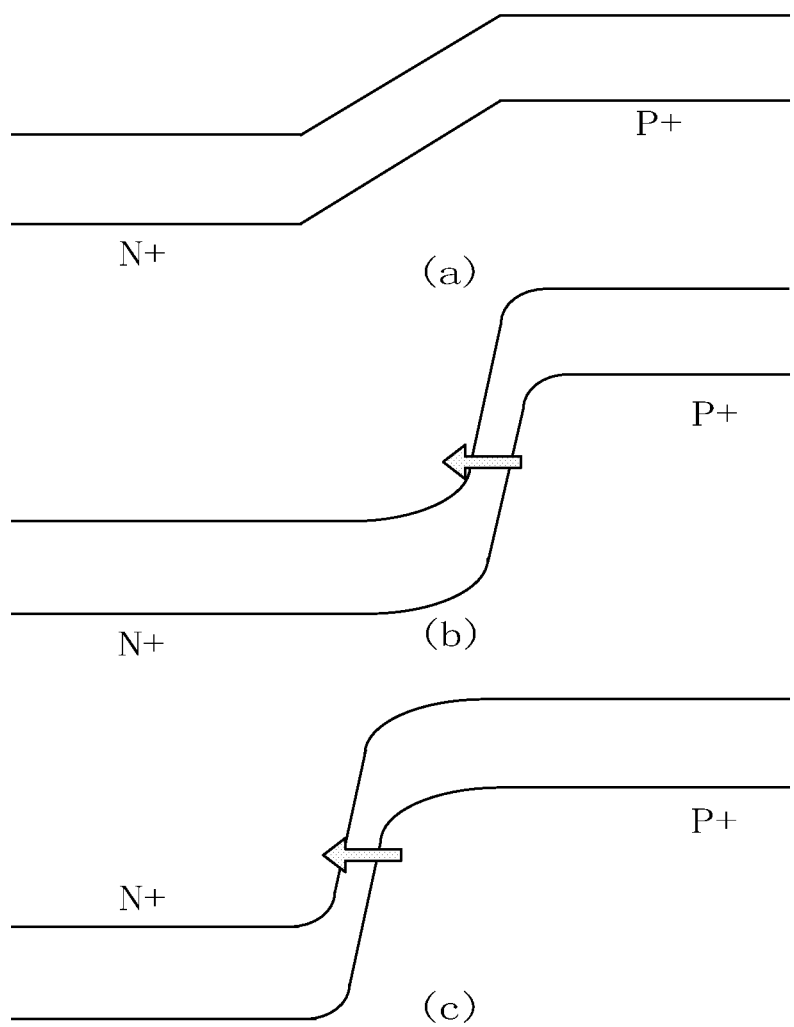
Figure 4:
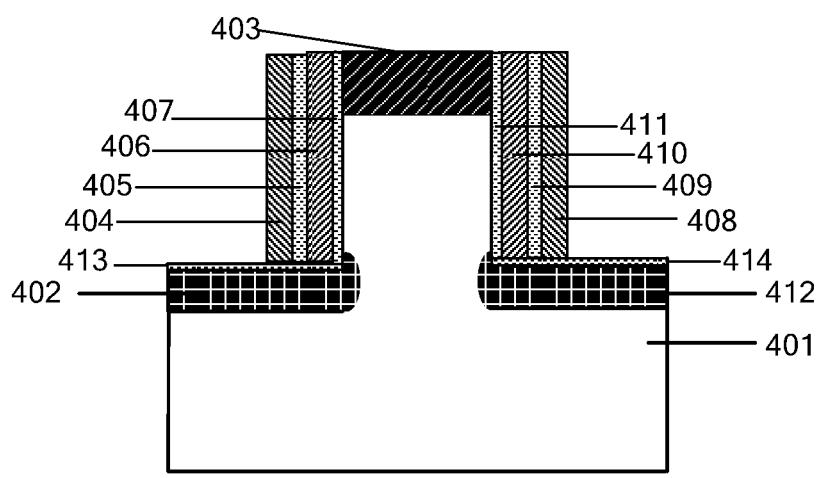
FIG. 4 is a schematic diagram of the structure of a flash memory according to the present invention, wherein:
401—N− type or P− type silicon substrate; 402—P+ region I (corresponding to the N− type silicon substrate) or N+ region I (corresponding to the P− type silicon substrate); 403—N+ region I (corresponding to the N− type silicon substrate) or P+ region I (corresponding to the P− type silicon substrate); 404—control gate I; 405—block oxide layer I; 406—polysilicon floating gate I; 407—tunneling oxide layer I; 408—control gate II; 409—block oxide layer II; 410—polysilicon floating gate II; 411—tunneling oxide layer II.

The structure of the flash memory fabricated in the embodiment is shown in FIG. 4, wherein an N− type silicon 401 is used as a substrate; two P+ regions, that is, P+ region I 402 and P+ region II 412, are located at the two end portions of the silicon surface, and two channel regions perpendicular to the surface are arranged therebetween; in the top portion of the channels, an N+ region 403 shared by the two channels is arranged; on the outer side of the two channels, a tunneling oxide layer I 407 and a tunneling oxide layer II 411, a polysilicon floating gate I 406 and a polysilicon floating gate II 410, a block oxide layer I 405 and a block oxide layer II 409, as well as a polysilicon control gate I 404 and a polysilicon control gate II 408 are arranged. The whole device is a two-bit TFET type flash memory with vertical channels. In this embodiment, the memory cell on the left is defined as cell I while the memory cell on the right is defined as cell II.

Figure 5A:
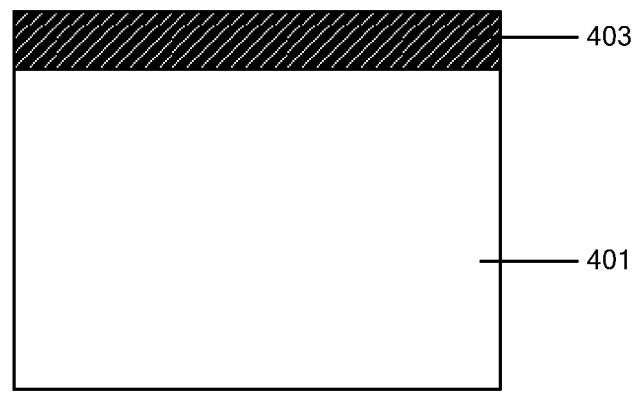
Figure 5B:
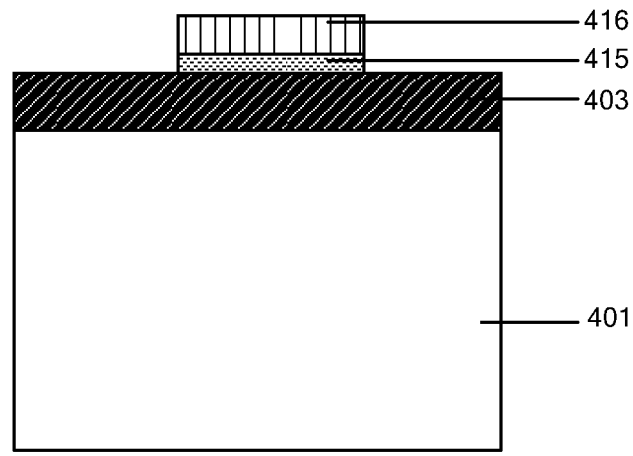
Figure 5C:
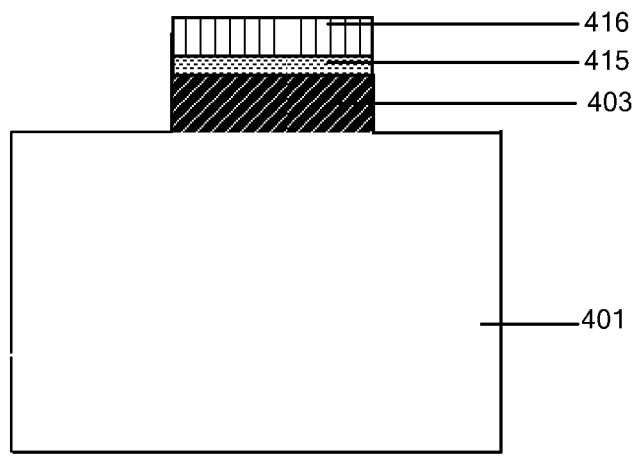
Figure 5D:
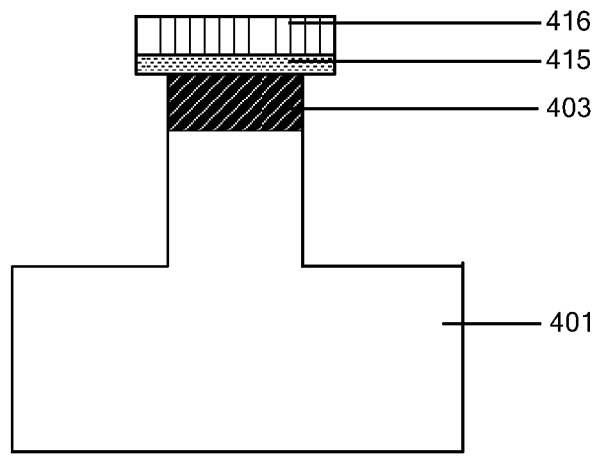
Figure 5E:
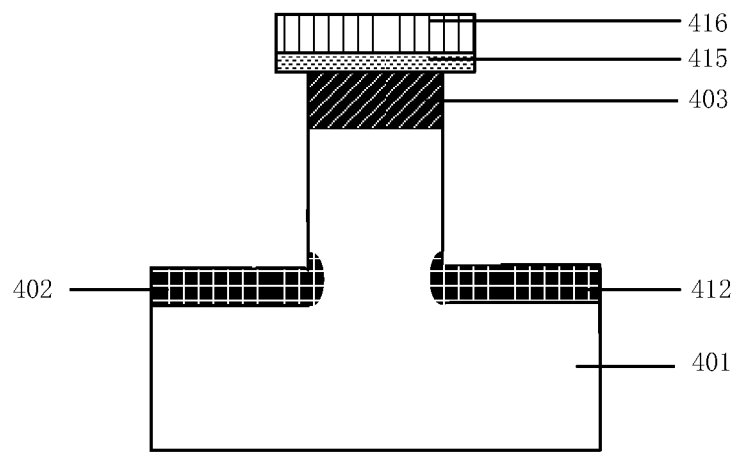
Figure 5F:
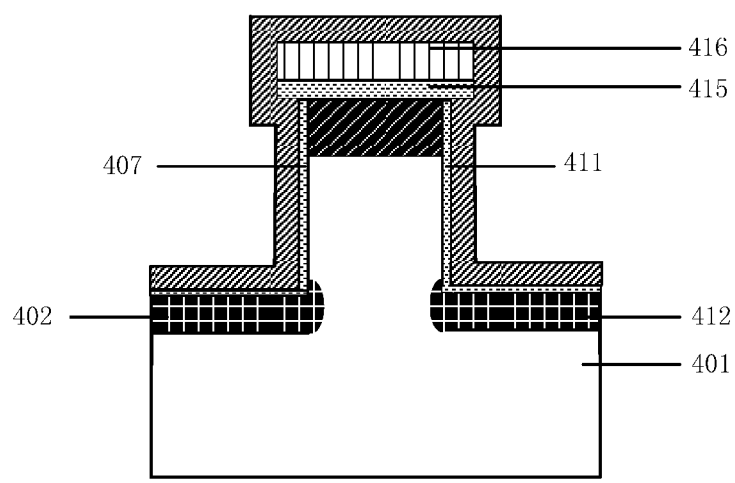
Figure 5G:
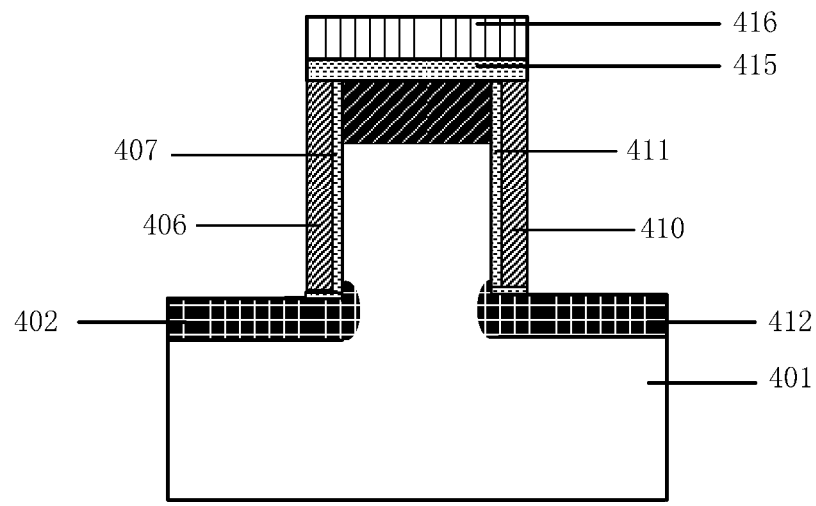
Figure 5H:
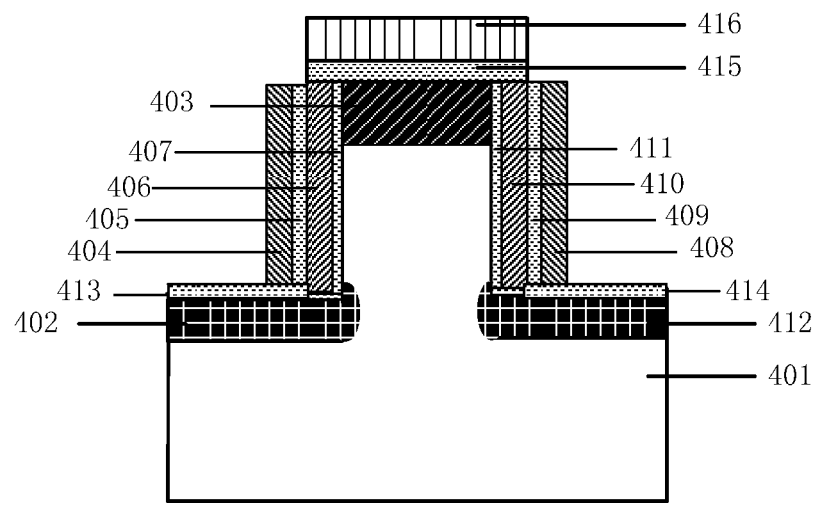

The fabrication of the above two-bit flash memory comprises following steps:

(1) performing a single-sided polishing with respect to a N-type bulk silicon substrate 401, performing a shallow trench isolation and performing and an arsenic implantation, to form a structure as shown in FIG. 5(a), wherein the junction depth of a resultant N+ region 403 of the device is 250 nm;

(2) depositing silicon dioxide having a thickness of 30 nm and silicon nitride having a thickness of 120 nm, and etching anisotropicly the silicon dioxide and the silicon nitride to form a double-layer hard mask, that is, a silicon dioxide hard mask 415 and a silicon nitride hard mask 416, as shown in FIG. 5(b);

(3) anisotropicly etching the silicon by 250 nm by using ICP with a high selection ratio to form a structure as shown in FIG. 5(c);

(4) isotropicly etching the silicon by 100 nm through RIE to form a channel surface which is under the floating gate under the silicon oxide hard mask 415, as shown in FIG. 5(d);

(5) implanting boron at an angle of 15 degrees to form two P+ regions, that is, a P+ region I 402 and a P+ region II 412, as shown in FIG. 5(e);

(6) thermally growing a sacrificial oxide layer to improve the surface property of the channel, cleaning by using hydrofluoric acid to remove the sacrificial oxide layer, then depositing an oxide layer of 10 nm, subsequently depositing a first layer of polysilicon with a thickness of 90 nm and heavily doping the first layer of polysilicon, and then performing a rapid thermal annealing (RTA) to activate the impurities, as shown in FIG. 5(f);

(7) anisotropicly etching the first layer of polysilicon by using ICP with a high selection ratio so that the polysilicon directly under the hard mask 416 and hard mask 415 is remained, to form a polysilicon floating gate I 406 and a polysilicon floating gate II 410; then etching the oxide layers on the both sides to expose the silicon substrate, as shown in FIG. 5(g);

(8) further depositing an oxide layer with a thickness of 15 nm (including a silicon oxide sidewall I 413, a block oxide layer I 405, a block oxide layer II 409 and a silicon oxide sidewall 414); subsequently depositing a second layer of polysilicon with a thickness of 50 nm; implanting phosphorus at an angle of 0 degree and activating the phosphorus through RTA; and then etching the second layer of polysilicon to form a control gate I 404 and a control gate II 408, as shown in FIG. 5(h).

The subsequent steps are of conventional process flow, including removing the silicon nitride hard mask 416, depositing a low temperature oxygen layer, etching to form wire holes, sputtering metal, forming a metal line, and performing alloying and passivation, etc. Finally, a testable flash memory cell is formed.

In order to describe the operation of the device according to the present invention more specifically, the operation mode of the device is illustrated by taking the cell I formed by the channel on the left as an example.

Programming: in the case of programming the present device, an appropriate positive voltage is applied to the control gate I 404 while the P+ region I 402 is grounded or a negative voltage is applied to the P+ region I 402 and a positive voltage is applied to the N+ region 403. Under the conditions of such biases, the electrons of the P+ region I 402 may enter into the channel region by tunneling and then flow toward the N+ region 403 along the channel direction. In the case where the bias applied is suitable, a part of the electrons may obtain sufficient energy and go beyond the barrier height of Si—$SiO_2$ to enter into the polysilicon floating gate, so that the programming of the cell I of the device is accomplished. During the process of programming the cell I, in order not to cause crosstalk to the cell II, the control gate II 408 is grounded while the bias of the P+ region II 412 is the same as that of the P+ region I 402.

In the same way, the same method is adopted in programming the cell II, wherein corresponding biases may be applied with reference to the programming process of the cell I.

Erasing: the erasing operation of the present device is implemented by injecting holes into the floating gate. Taking the cell I as an example, an appropriate negative voltage is applied to the control gate I 404 while the P+ region I 402 is grounded or a negative voltage is applied to the P+ region I 402 and a positive voltage is applied to the N+ region I 403. Under the conditions of such biases, the electrons may tunnel into the N+ region I 403 from a location of the channel region close to the N+ region. The remaining holes may drift towards the P+ region I 402 under such biases. In the case where the biases applied are suitable, some holes may obtain sufficient energy and go beyond the barrier height of Si—$SiO_2$ to enter into the polysilicon floating gate 406 and recombine with the electrons therein, so that the erasing of the cell I is accomplished. Similar to the programming process, during the process of the erasing of the cell I, in order not to cause crosstalk to the cell II, the control gate II 408 is grounded while the bias of the P+ region II 412 is the same as that of the P+ region I 402.

In the same way, the same method is adopted in the erasing of the cell II, wherein corresponding biases may be applied with reference to the erasing process of the cell I.

Reading: the reading of the device storage status is performed in a way similar to that of N-TFET, which is illustrated below in detail by taking the cell I as an example. In the case of reading, a lower positive voltage is applied to the control gate I 404 while the P+ region I 402 is grounded or a negative voltage is applied to the P+ region I 402 and a lower positive voltage is applied to the N+ region I 403. The settings of the biases require reading the current from the N+ region I 403 without performing an false programming. Similarly, when reading the cell I, in order not to cause crosstalk to the cell II, the control gate II 408 of the cell II is grounded while the bias of the P+ region II 412 is the same as that of the P+ region I 402. In the case where there are electrons stored in the polysilicon floating gate I 406, the current read from the N+ region 403 is lower; in the case where the electrons stored in the floating gate I 406 have been recombined with holes, the current read from the N+ region 403 becomes higher, so that the reading of the two storage statuses is achieved.

In the same way, the same method is employed in the reading of the cell II, wherein corresponding biases may be applied with reference to the erasing process of the cell I.

By means of the above mentioned programming, erasing and reading operations, the whole device may be operated normally and the storage function may be achieved.

What is claimed is:

1. A flash memory, comprising two memory cells of vertical channels, wherein a lightly-doped N type silicon is used as a substrate; a P+ region is provided on each of the both ends of the silicon surface, and two channel regions perpendicular to the surface are provided between the P+ regions; an N+ region shared by the two channels is provided over the channels; a tunneling oxide layer, a polysilicon floating gate, a block oxide layer and a polysilicon control gate are sequentially provided on the outer side of each channel from inside to outside; and the polysilicon floating gate and the polysilicon control gate are isolated from the P+ region by a sidewall oxide layer.

2. A method for fabricating the flash memory according to claim 1, comprising the following steps:
   (1) performing shallow trench isolation with respect to a lightly-doped N-type bulk silicon substrate to form an active region, and performing an ion implantation to the silicon surface to form an N+ layer;
   (2) sequentially depositing silicon dioxide and silicon nitride on the N+ layer, and anisotropicly etching the silicon dioxide and silicon nitride to form a double-layered hard mask;
   (3) anisotropicly etching the silicon under protection of the double-layered hard mask to form an N+ region;
   (4) isotropicly etching the silicon until the lower end of the channel to form a channel surface under the double-layered hard mask;
   (5) performing an ion implantation at a predetermined angle with respect to the silicon surface on the outer sides of the channel to form two P+ regions;
   (6) thermally growing firstly a sacrificial oxide layer, and removing the sacrificial oxide layer by wet etching; then further thermally growing an oxide layer; subsequently, depositing a layer of polysilicon, heavily doping the layer of polysilicon, and performing rapid thermal annealing thereto to activate the impurities;
   (7) anisotropicly etching the polysilicon formed in step 6) so that the polysilicon directly under the double-layer hard mask is remained, to form a polysilicon floating gate; then etching the oxide layer on the outer side of the floating gate to expose the silicon substrate; and
   (8) depositing an oxide layer to form a block oxide layer and a sidewall oxide layer; subsequently, depositing another layer of polysilicon; implanting impurities into the another layer of polysilicon at an angle of 0 degree, and performing RTA to activate the impurities; and then etching the another layer of polysilicon to form a control gate.

3. An operation method of the flash memory according to claim 1, wherein each of the two memory cells is operated independently, and with respect to any one of the memory cells, in the case of programming, a positive bias is applied to the N+ region and the P+ region is grounded or a negative bias is applied to the P+ region while a positive bias is applied to the control gate, so that a part of the electrons enter into the polysilicon floating gate by passing through the tunneling oxide layer; in the case of erasing, a positive bias is applied to the N+ region and the P+ region is grounded or a negative bias is applied to the P+ region while a negative bias is applied to the control gate, so that a part of the holes enter into the polysilicon floating gate by passing through the tunneling oxide layer and recombine with the electrons therein; in the case of reading, a positive bias is applied to the N+ region and the P+ region is grounded or a negative bias is applied to the P+ region while a positive bias is applied to the control gate and is controlled to read the current from the N+ region without performing a false programming; during the process of performing the programming, erasing and reading with respect to one memory cell, the control gate of another memory cell is grounded while the bias of its P+ region is the same as that of the former cell.

* * * * *